United States Patent [19]

Corbett et al.

[11] Patent Number: 4,899,107
[45] Date of Patent: Feb. 6, 1990

[54] DISCRETE DIE BURN-IN FOR NONPACKAGED DIE

[75] Inventors: Tim J. Corbett; Alan G. Wood, both of Boise, Id.

[73] Assignee: Micron Technology, Inc., Boise, Id.

[21] Appl. No.: 252,606

[22] Filed: Sep. 30, 1988

[51] Int. Cl.[4] .................... G01R 31/28; G01R 31/02
[52] U.S. Cl. .................... 324/158 F; 324/158 R; 324/73.1
[58] Field of Search .......... 324/158 D, 158 P, 73 PC, 324/72.5, 73 R, 158 F; 437/8; 439/66, 68, 91, 374, 377, 378, 379

[56] References Cited

U.S. PATENT DOCUMENTS

| | | | |
|---|---|---|---|
| 4,281,449 | 8/1981 | Ports et al. | 324/158 R |
| 4,500,836 | 2/1985 | Staudacher | 324/158 R |
| 4,739,257 | 4/1988 | Jenson et al. | 324/158 F |
| 4,766,371 | 8/1988 | Moriya | 324/158 F |

FOREIGN PATENT DOCUMENTS 0017172 1/1984 Japan .................. 324/158 F
0173173 8/1986 Japan .

OTHER PUBLICATIONS

*Microelectronics Packaging Handbook*, Tummala, Rao R., 1942-, Copyright 1989 by V. Reinhold, Library of Congress 88-14254; pp. 4-11.

Primary Examiner—Reinhard J. Eisenzopf
Assistant Examiner—Vinh P. Nguyen
Attorney, Agent, or Firm—Stanley N. Protigal; Angus C. Fox, III; Jon P. Busack

[57] ABSTRACT

A reusable burn-in/test fixture for discrete TAB die consists of two halves. The first half of the test fixture is a die cavity plate for receiving semiconductor dice, and contains cavities in which die are inserted. The second half establishes electrical contact with the dice and with a burn-in oven. The test fixture need not be opened until the burn-in and electrical test are completed. After burn-in stress and electrical test, the die are removed from the test fixture and depositioned accordingly. The technique will allow all elements of the burn-in/test fixture to 100% reusable.

16 Claims, 2 Drawing Sheets

DISCRETE DIE BURN-IN FOR NONPACKAGED DIE

FIELD OF THE INVENTION

This invention relates to electrical test equipment for semiconductor devices. More specifically, the invention relates to an apparatus and method to perform dynamic burn-in and full electrical/performance/speed testing on discrete nonpackaged or semi-packaged die (TAB bumps).

BACKGROUND OF THE INVENTION

Semiconductor devices are subjected to a series of test procedures in order to assure quality and reliability. This testing procedure conventionally includes "probe testing", in which individual dice, while still on a wafer, are initially tested to determine functionality and speed. Probe cards are used to electrically test die at that level. The electrical connection interfaces with only a single die at a time in wafer; not discrete die.

If the wafer has a yield of functional dice which indicates that quality of the functional dice is likely to be good, each individual die is assembled in a package to form a semiconductor device. Conventionally, the packaging includes a lead frame and a plastic or ceramic housing.

The packaged devices are then subjected to another series of tests, which include burn-in and discrete testing. Discrete testing permits the devices to be tested for speed and for errors which may occur after assembly and after burn-in. Burn-in accelerates failure mechanisms by electrically exercising the devices (UUT) at elevated temperatures, thus eliminating potential failures which would not otherise be apparent at nominal test conditions.

Variations on these procedures permit devices assembled onto circuit arrangements, such as memory boards, to be burned-in, along with the memory board in order to assure reliability of the circuit, as populated with devices. This closed assembly testing assumes that the devices are discretely packaged in order that it can then be performed more readily. It is proposed that devices be packaged without conventional lead frames. This creates two problems for being conventional test methods. Firstly, discrete testing is more difficult because the conventional lead frame package is not used. Furthermore, multiple device may be assembled into a single package, thereby reducing the performance of the package to that of the die with the lowest performance. In other words, the ability to presort the individual dice is limited that obtained through probe testing. Secondly, the packaging may have other limitations which are aggravated by burn-in stress conditions so that the packaging becomes a limitation for burn-in testing.

Semiconductor packaging has been referred to in terms of "levels" of packaging. The chip capsule generally constitutes a first level of packaging. A second level would then be a "card" or a printed circuit board. A third level may include second level packaging combined with a motherboard. A fourth level may follow the third level. In each case, the packaging to a level involves assembly cost.

Ideally, it would be desirable to permit testing of individual dice in a manner similar to that accomplished with discrete packaged semiconductor devices.

SUMMARY OF THE INVENTION

According to the present invention, a reusable burn-in/test fixture for discrete TAB die is provided. The fixture consists of two halves, one of which is a die cavity plate for receiving semiconductor dice as the units under test (UUT); and the other half establishes electrical contact with the dice and with a burn-in oven.

The first half of the test fixture contains cavities in which die are inserted circuit side up. The die will rest on a floating platform. A support mechanism under the die platform will provide a constant uniform pressure or force to maintain adequate electrical contact to the die contacts on the UUT to probe tips on the second half. The support mechanism will compensate for variations of overall die thickness.

The second half has a rigid high temperature rated substrate, on which are mounted probes for each corresponding die pad. Each probe is connected to an electrical trace on the substrate (similar to a P.C. board) so that each die pad of each die is electrically isolated from one another for high speed functional testing purposes. The probe tips are planar so that contact to each die pad occurs simultaneously. The probe tips are arranged in an array to accommodate eight or sixteen dice.

The traces from the probes terminate in edge fingers to accept a conventional card edge connector. The geometry of the probes and edge fingers are optimized to avoid electrical test artifacts.

The two halves of the test fixture are joined so that each pad on each die aligns with a corresponding probe tip. The test fixture is configured to house groups of 8 or 16 die for maximum efficiency of the functional testers. The test fixture need not be opened until the burn-in and electrical test are completed. After burn-in stress and electrical test, the die are removed from the test fixture and depositioned accordingly. The fully burned-in and tested die are available for any type of subsequent assembly application(s).

This technique will allow all elements of the burn-in/test fixture to 100% reusable.

DETAILED DESCRIPTION OF THE PREFERRED EMBODIMENT

Figure 1:
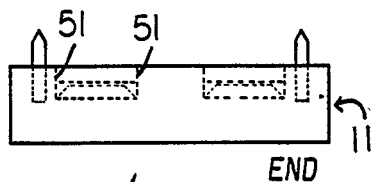
FIGS. 1, 2 and 3 show an inventive burn-in-fixture in end, side and top views.
Figure 2:
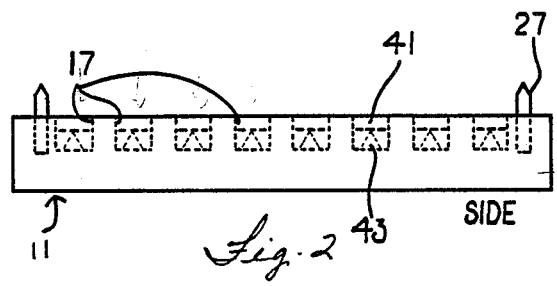
Figure 3:
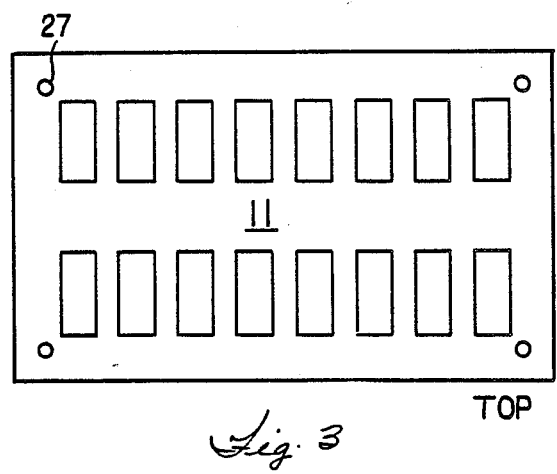
Figure 4:
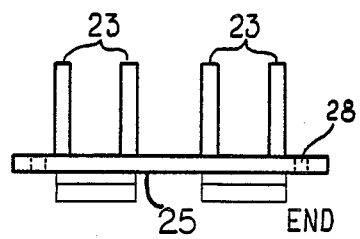
FIGS. 4-6 show end, side and plan views, respectively of a probe plate constructed according to the invention.
Figure 5:
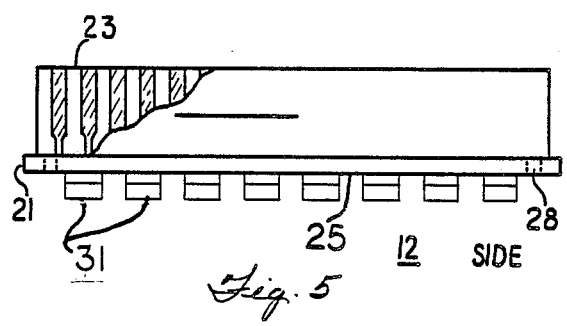
Figure 6:
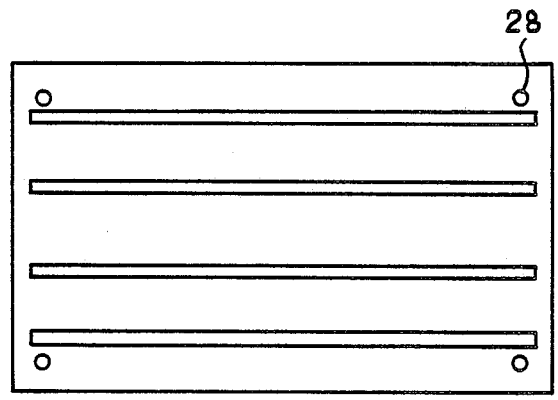

Referring to FIGS. 1 through 3, the inventive burn-in fixture includes a die cavity plate, 11, shown in FIG. 1, and a probe plate 12 shown in FIGS. 4 through 6. The die cavity plate 11 includes a plurality of die receiving cavities 17, each of which is in dimension to receive a semiconductor die.

The probe plate 12 includes a main plate portion 21, from which extends a plurality of edge connectors 23. The probe plate 12 aligns with the die cavity plate 11 so that a bottom surface 25 of the main plate portion 21 aligns with the die receiving cavities 17 on the die cavity plate 11. Alignment devices, such as dowels 27 and dowel-receiving cavities 28 are used to establish an alignment of the probe plate 12 with the die cavity plate 11.

The bottom surface 25 of the probe plate 12 has a number of probe tips 31 extending therefrom. The probe tips 31 are sufficiently flexible to compensate for variations in die pad height. The probe tips align with the die receiving cavities 17. More specifically, the probe tips 31 align with the die receiving cavity 17 in a manner which, when individual dice are located in the individual cavities 17, the probe tips 31 electrically communicate with individual compact pads on the dice.

The main plate portion of 21 of the probe plate 12 includes a series of circuit traces (not shown) which communicate with individual contacts on the edge connectors 23. This permits the edge connectors 23 to be used to connect the contact pads on the dice with external electrical equipment (not shown).

Each die receiving cavity 17 includes a floating platform 41 which is supported by a spring mechanism 43. In the embodiment shown, the spring mechanism 43 is an elastomeric polymer, although coil springs or the like can be used. The purpose of the spring mechanism 43 is to bias the floating platform 41 upwards so that when the dice are inserted into the die receiving cavities 17 and the fixture is assembled, each die pad will be in contact with its associated tip 31. The biasing force of the spring mechanisms 43 and the travel of the floating platforms 41 must be uniform enough and provide enough travel that when each of the die receiving cavities 17 is floated with a die, and the probe plate 12 is mounted to the die cavity plate 11, the probe tips 31 will each contact the die pads. As a result of the uniformity of travel and biasing, the mating of the die cavity plate 11 and the probe plate 12 need only accommodate the need to provide an even biasing of the dice against the probe tips 31 to a degree sufficient for each probe tip 31 to contact its respectivedie pad 31. This means that lateral alignment, as established by the dowels 27 and holes 28 is more critical than the precise closeness of the probe plate 12 to the die cavity plate 11.

In the example shown, a number of edge connectors 23 are shown, wherein the edge connector 23 is in optimum proximity to ends 51 of the die-receiving cavity 17. Since the die pad are normally located at the ends 51, the edge connector 23 are in close proximity to the die pads, thereby resulting in a very short circuit length between the die pads and the edge connectors 23. Of course, it is possible to provide either fewer or more edge connectors 23 as is convenient for a design consideration. It is likely that a large number of edge connectors 23 will be provided because of the large number of contacts on each semiconductor die.

The geometries of the probe and edge fingers are optimized to avoid electrical test artifacts. In a preferred embodiment, the edge fingers and the card edge connector will utilize 50 or 25 mil pitch technology thus providing the density required for each die to have isolated I/0 paths. Probe tips will be designed to insure low contact resistance while minimizing the damage or deformation of the electrical contact structure of the die.

The assembled fixture is adapted into conventional test equipment, such as a burn-in oven. In case of a burn-in oven, it may be desirable to connect the edge connectors to a burn-in circuit, in which common connectors are used for the multiple devices. In any case, it is possible to use the edge connectors 23 to connect the die in a test fixture to existing discrete apparatus (not shown).

What has been described is a very specific configuration of a test fixture. Clearly, modification to the existing apparatus can be made within the scope of the invention. Accordingly, the invention should be read only as limited by the claims.

We claim:

1. Discrete testing apparatus for testing a plurality of semiconductor devices in unpackaged die form, for performing electrical tests in a manner similar to that accomplished with discrete packaged semiconductor devices, comprising:
   (a) a first plate;
   (b) a plurality of die-receiving cavities in the first plate;
   (c) a second plate mating with the first plate;
   (d) alignment means for aligning the first plate with the second plate;
   (e) said second plate having a plurality of die contacting conductors extending therefrom;
   (f) the die contacting conductors being positioned so that, when the first plate and the second plate are aligned by the alignment means and the dice are positioned in the die-receiving cavities, the die contacting conductors are in alignment with contact locations on the dice; and
   (g) connector terminals in an electrical communication with the die contacting conductors, the conductor terminals being mounted to the one of said plates.

2. Discrete testing apparatus as described in claim 1, further comprising:
   means to bias die received in the die receiving cavities with the die contacting conductors after the first and second plates have been mated.

3. Discrete testing apparatus as described in claim 1, further comprising:
   the die receiving cavities having biased platforms therein, the bias platforms exerting biasing forces against the dice which are sufficiently uniform to cause the dice to establish contact with the respective die contacting conductors.

4. Discrete testing apparatus as described in claim 3, further comprising:
   the die contacting conductors including a plurality of flexible rods which extend into the die receiving cavities after the first and second plates have been mated.

5. Discrete testing apparatus as described in claim 3, further comprising:
   the die contacting conductors including a plurality of contact pads which are in alignment with the die receiving cavities after the first and second plates have been mated.

6. Discrete testing apparatus as described in claim 1, further comprising:
   the die contacting conductors including a plurality of flexible rods which extend into the die receiving cavities after the first and second plates have been mated.

7. Discrete testing apparatus as described in claim 1, further comprising:
   the die contacting conductors including a plurality of contact pads which are in alignment with the die receiving cavities after the first and second plates have been mated.

8. Discrete testing apparatus as described in claim 1, further comprising:
   platforms corresponding to each die receiving cavity, the platforms being biased by elastomeric polymers so as to cause the dice to establish contact with the respective die contacting 9. Discrete testing apparatus for testing a plurality of semiconductor devices in unpackaged die form, for performing electrical tests in a manner similar to that accomplished with discrete packaged semiconductor devices, comprising:

(a) a first plate;

(b) a plurality of die-receiving cavities in the first plate;

(c) a second plate having a plurality of die contacting conductors extending therefrom;

(d) alignment means for aligning the first plate with the second plate;

(e) the die contacting conductors being positioned on the second plate so that, when the first plate and the second plate are aligned by the alignment means and the dice are positioned in the die-receiving cavities, the die contacting conductors are in alignment with contact locations on the dice;

(f) connector terminals in an electrical communication with the die contacting conductors, the connector terminals being mounted to the second plate; and (g) the die receiving cavities having biased platforms therein, the biased platforms extending biasing forces against the dice which are sufficiently uniform to cause the dice to establish contact with the respective die contacting conductors on the second plate.

10. Discrete testing apparatus as described in claim 9, further comprising:

means to bias die received in the die receiving cavities with the die contacting conductors after the first and second plates have been mated.

11. Discrete testing apparatus as described in claim 9, further comprising:

the die receiving cavities having biased platforms therein, the bias platforms exerting biasing forces against the dice which are sufficiently uniform to cause the dice to establish contact with the respective die contacting conductors.

12. Discrete testing apparatus as described in claim 11, further comprising:

the die contacting conductors including a plurality of flexible rods which extend into the die receiving cavities after the first and second plates have been mated.

13. Discrete testing apparatus as described in claim 11, further comprising:

the die contacting conductors including a plurality of contact pads which are in alignment with the die receiving cavities after the first and second plates have been mated.

14. Discrete testing apparatus as described in claim 9, further comprising:

the die contacting conductors including a plurality of flexible rods which extend into the die receiving cavities after the first and second plates have been mated.

15. Discrete testing apparatus as described in claim 9, further comprising:

the die contacting conductors including a plurality of contact pads which are in alignment with the die receiving cavities after the first and second plates have been mated.

16. Discrete testing apparatus as described in claim 9, further comprising:

the die receiving cavities having platforms therein which are biased by elastomeric polymers so as to cause the dice to establish contact with the respective die contacting conductors.

* * * * *

UNITED STATES PATENT AND TRADEMARK OFFICE
CERTIFICATE OF CORRECTION

PATENT NO. : 4,899,107
DATED : February 6, 1990
INVENTOR(S) : Tim J. Corbett, Alan G. Wood It is certified that error appears in the above—identified patent and that said Letters Patent is hereby corrected as shown below:

Column 3, line 33, delete "respectivedie" and insert -- respective die --;

Column 4, line 68, after "contacting," please insert -- conductors. --.

Signed and Sealed this

Second Day of November, 1993

Attest:

BRUCE LEHMAN

Attesting Officer

Commissioner of Patents and Trademarks